United States Patent [19]

Kerschner et al.

[11] Patent Number: 5,498,964
[45] Date of Patent: Mar. 12, 1996

[54] CAPACITIVE ELECTRODE SYSTEM FOR DETECTING OPEN SOLDER JOINTS IN PRINTED CIRCUIT ASSEMBLIES

[75] Inventors: Ronald K. Kerschner; David T. Crook; Lisa M. Kent, all of Loveland, Colo.

[73] Assignee: Hewlett-Packard Company, Palo Alto, Calif.

[21] Appl. No.: 308,236

[22] Filed: Sep. 19, 1994

Related U.S. Application Data

[62] Division of Ser. No. 981,665, Nov. 25, 1992, Pat. No. 5,420,500.

[51] Int. Cl.⁶ .................................................. G01R 31/08
[52] U.S. Cl. ........................... 324/530; 324/67; 324/688; 324/750; 324/72.5
[58] Field of Search ................................ 324/688, 72.5, 324/754, 67, 530, 690

[56] References Cited

U.S. PATENT DOCUMENTS

| | | | |
|---|---|---|---|
| 3,798,541 | 3/1974 | Campbell | 324/688 |
| 3,860,866 | 1/1975 | Dornberger | 324/530 |
| 3,860,918 | 1/1975 | Cencel | 324/688 |
| 4,686,454 | 8/1987 | Pecukonis | 324/67 |
| 4,695,788 | 9/1987 | Marshall | 324/754 |
| 4,801,866 | 1/1989 | Wixley | 324/72.5 |
| 5,420,500 | 5/1995 | Kerschner | 324/72.5 |
| 5,444,364 | 8/1995 | Satterwhite | 324/67 |

Primary Examiner—Kenneth A. Wieder
Assistant Examiner—Jose M. Solis

[57] ABSTRACT

Disclosed is a system that determines whether input and output leads of semiconductor components are present and properly soldered to a printed circuit board. The system includes a signal source which is connected to a wiring trace on the printed circuit board, which is soldered to the lead being tested. A capacitive test probe is placed on top of the component and connected to a capacitance measuring device. The signal source signal is capacitively coupled through the lead of the integrated circuit package being tested to the capacitive test probe, so if a predetermined capacitance is measured by the capacitance measuring device, the lead is connected to the circuit assembly. As the capacitances being measured are small, the capacitive test probe may include an amplifier, a shield or a buffer circuit to reduce stray capacitance.

10 Claims, 12 Drawing Sheets

CAPACITIVE ELECTRODE SYSTEM FOR DETECTING OPEN SOLDER JOINTS IN PRINTED CIRCUIT ASSEMBLIES

CROSS REFERENCE TO RELATED APPLICATION

This is a divisional of application Ser. No. 07/981,665 filed on Nov. 25, 1992, now U.S. Pat. No. 5,420,500.

FIELD OF THE INVENTION

This invention relates to measuring and testing devices and more particularly to in-circuit testing devices. Even more particularly, the invention relates to an electrode plate system to test loaded printed circuit boards for open solder joints.

BACKGROUND OF THE INVENTION

It is important that electronic components and printed circuit boards be tested after the components have been soldered to the printed circuit boards. Several different approaches have been developed for testing the components and printed circuit boards, including functional testing, in-circuit testing, and manufacturing defect analyzers.

Functional testing uses a procedure of applying predetermined input signals and monitoring the output of a printed circuit board to determine if all of the components are present and operating properly on the circuit board. While functional testing provides a way of determining whether the P.C. board is functioning properly, it provides little or no information regarding the functioning of individual components on the board. Complex programming techniques have been used to provide limited information as to the location of non-functioning components on the board by carefully selecting input data and analyzing the output results. Such systems are complex, often costly to implement, and normally provide only vague information as to the location of malfunctioning components.

Because of the limitations of functional testing, in-circuit testing techniques have been used to individually test the components on the printed circuit board to determine if these components are working properly. This process uses a "bed of nails" tester to access each individual component and test that component individually. In this manner, non-functioning components can be identified and replaced to prevent the entire circuit board from being scrapped. This process works well for simple components where the circuit inside the component is known and can be easily tested. If the component being tested is very complex, or if the circuit inside the component is unknown, in-circuit testing may not achieve satisfactory results.

One very important potential problem that must be tested on every printed circuit board is whether all the pins of every component are in fact soldered to the circuit board. Functional testing may miss a particular pin, if the Xfunctions performed by that particular pin are not thoroughly tested in functional test. Testing for this type of fault is particularly difficult when the circuit inside the component is unknown, such as the case with application specific integrated circuits (ASICs). Because of the large number of ASICs and the complexity of these devices, it is often not feasible to design a functional test to isolate this particular component.

Manufacturing defect analyzers are another class of testing devices that provide simpler tests and are less expensive to implement. These devices are designed to locate manufacturing faults, such as shorts on a printed circuit board, missing integrated circuits, bent component leads, etc. Although these devices do a reasonably good job of finding shorts and gross analog faults, they are marginal when testing digital sections of the board as it is difficult to detect opens with this type of test when digital components are connected in parallel.

There is need in the art for a device and method which will determine whether all pins of a component including digital components are soldered to a circuit board in a simple and inexpensive manner. There is further need in the art for such a device and method which does not rely on knowledge of the operation of the circuit contained in the component. Although related U.S. Pat. No. 5,124,660 entitled Identification of Pin-Open Faults by Capacitive Coupling Through The Integrated Circuit by Ugur Cilingiroglu, issued Jun. 23, 1992 and related application Ser. No. 07/892,868 entitled Identification of Pin-Open Faults by Capacitive Coupling Through the Integrated Circuit. Package by Ugur Cilingiroglu, Kevin Keirn and David Crook show the general concept of capacitive testing, it is important to increase the signal to noise ratio and to decrease the stray capacitance. The present invention meets these and other needs. Related U.S. Pat. No. 5,124,660 and related application Ser. No. 07/892,868, assigned to the assignee of this invention are specifically incorporated herein by reference for all that they teach.

SUMMARY OF THE INVENTION

It is an aspect of the present invention to provide an apparatus and method to test for a connection between a lead of an integrated circuit and a wire trace of a printed circuit board.

It is another aspect of the present invention to provide such an apparatus and method that does not rely on knowledge of the operation of the circuit contained inside the component.

It is a further aspect of the present invention to provide a test probe with sufficient shielding means to decrease the effects of stray capacitance and amplification means to increase the signal to noise ratio.

The above and other aspects of the present invention are accomplished in a system that overcomes the disadvantages and limitations of the prior art by providing an apparatus and method for determining whether semiconductor components are present and properly connected to a printed circuit board. The present invention determines whether connector leads, including input, output, power and ground, are connected to the traces on the printed circuit board regardless of the integrated circuit family being used.

Specifically, the invention uses a capacitive test probe placed on top of a nonconducting integrated circuit (I.C.) package. A connection is then made through a bed of nails tester or other means, to a circuit assembly wiring trace on a printed circuit (P.C.) board or similar device that should be soldered to the I.C. lead being tested. The bed of nails is connected to a signal. The output of the test probe is connected to a measuring device. The signal supplied to a test pin through the bed of nails, the P.C. board wiring trace, solder joint and a lead of the component is capacitively coupled through tile I.C. component package to the test probe. The signal out of the test probe is measured by the measuring device, and if this signal exceeds a predetermined threshold, the lead is considered to be properly soldered to the wire trace and that the wire trace is unbroken. The test probe may include an amplifier, a buffer circuit or other means to reduce sensitivity to noise and stray capacitance. The test probe may also be shielded to minimize stray capacitance.

In accordance with the present invention, the test probe used in the system has z axis travel which allows intimate coupling with the component being tested. Further, the test probe has x,y plane swivel or flex capability, which corrects for ally inclination in tile x,y plane to allow intimate coupling with the component being tested. The test probe is fixed in x,y space, that is it doesn't rotate about the z axis. It is a further aspect of the present invention that the dimensions of the capacitive plate of the test probe be substantially similar to the outer dimensions of the integrated circuit package being tested.

The advantage of the present invention is that it provides a simple and inexpensive system for determining if electrical components are present and properly soldered to the wire traces of the circuit board, and that the wire traces have proper conductivity. This invention eliminates the necessity of writing complex tests for large integrated circuit components such as ASICs.

BRIEF DESCRIPTION OF THE DRAWINGS

The above and other objects, features, and advantages of the invention will be better understood by reading the following more particular description of the invention, presented in conjunction with the following drawings, wherein.

DETAILED DESCRIPTION OF THE PRESENT INVENTION

Figure 1:
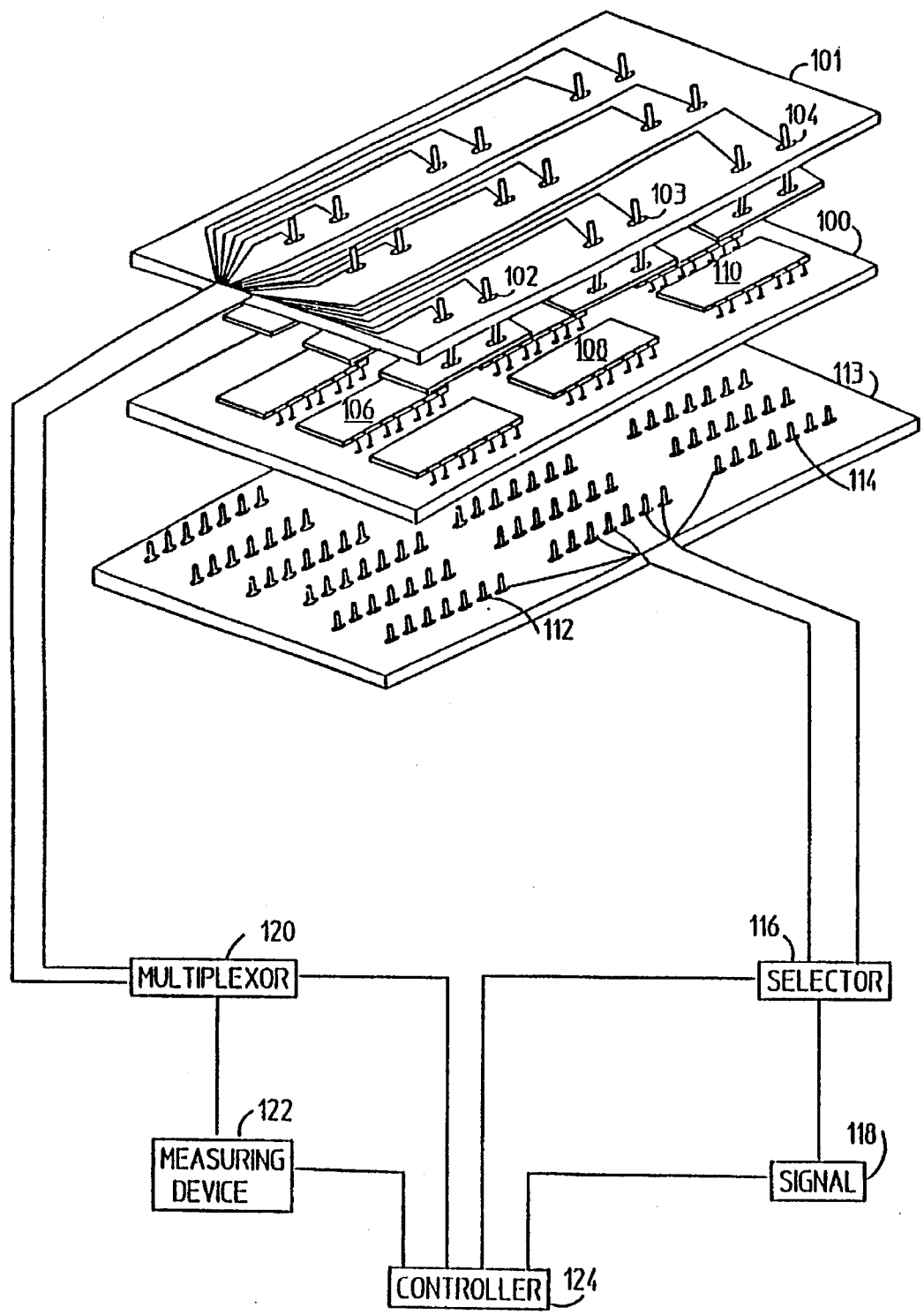
FIG. 1 shows one implementation of the invention being used to test a plurality of integrated circuits on a printed circuit board.

FIG. 1 shows a diagram of one implementation of the invention when used to test an entire printed circuit board. Referring now to FIG. 1, a printed circuit board 100 contains a plurality of integrated circuits 106, 108, 110, etc. A board 101, which contains a plate of capacitive test probes 102, 103, 104, etc., is placed over the top of the printed circuit board 100. Each test probe is mounted to test plate 101 so that it can comply with the outer surface of the corresponding I.C. component being tested. A bed of nails tester 113, containing a plurality of probe pins 112, 114, etc., is brought into contact with the bottom of the printed circuit board 100 to connect to the printed circuit wiring traces (not shown) on the printed circuit board 100. A signal source 118 supplies a signal to a selector 116. The selector 116 has a plurality of outputs, one for each of the test pins on the bed of nails tester 113. A multiplexor 120 contains a series of inputs, one for each of the capacitive test probes on the board 101. The output of the multiplexor is connected to a measuring device 122. A controller 124 is connected to the signal source 118, the selector 116, the multiplexor 120, and the measuring device 122.

To test all the integrated circuits on the printed circuit board 100, the controller first selects one of the pins on the bed of nails tester 113 by programming the selector 116. The pin selected will be the pin that connects to a printed circuit board trace on the printed circuit board 100 which is connected to the particular lead of the particular integrated circuit being tested. The controller then activates the signal source 118 to supply a signal through the selector 116 to the pin selected in the bed of nails 113 which is directly under the integrated circuit being tested. The controller 124 then selects the corresponding test probe on board 101 by programming the multiplexor 120. After the multiplexor is programmed to select the correct test probe, the controller activates the measuring device 122 to determine whether a predetermined signal is present on the test probe on board 101. If the predetermined signal is measured by the measuring device, the lead under test is connected to the trace on the printed circuit board. A reading lower than a predetermined limit will be indicative of an open solder joint.

This process is then repeated for each lead of each integrated circuit on the board. It is important to note that this process is independent of the integrated circuit family, and easily tests TTL, CMOS, etc., and can test multiple families on the same printed circuit board.

Figure 2:
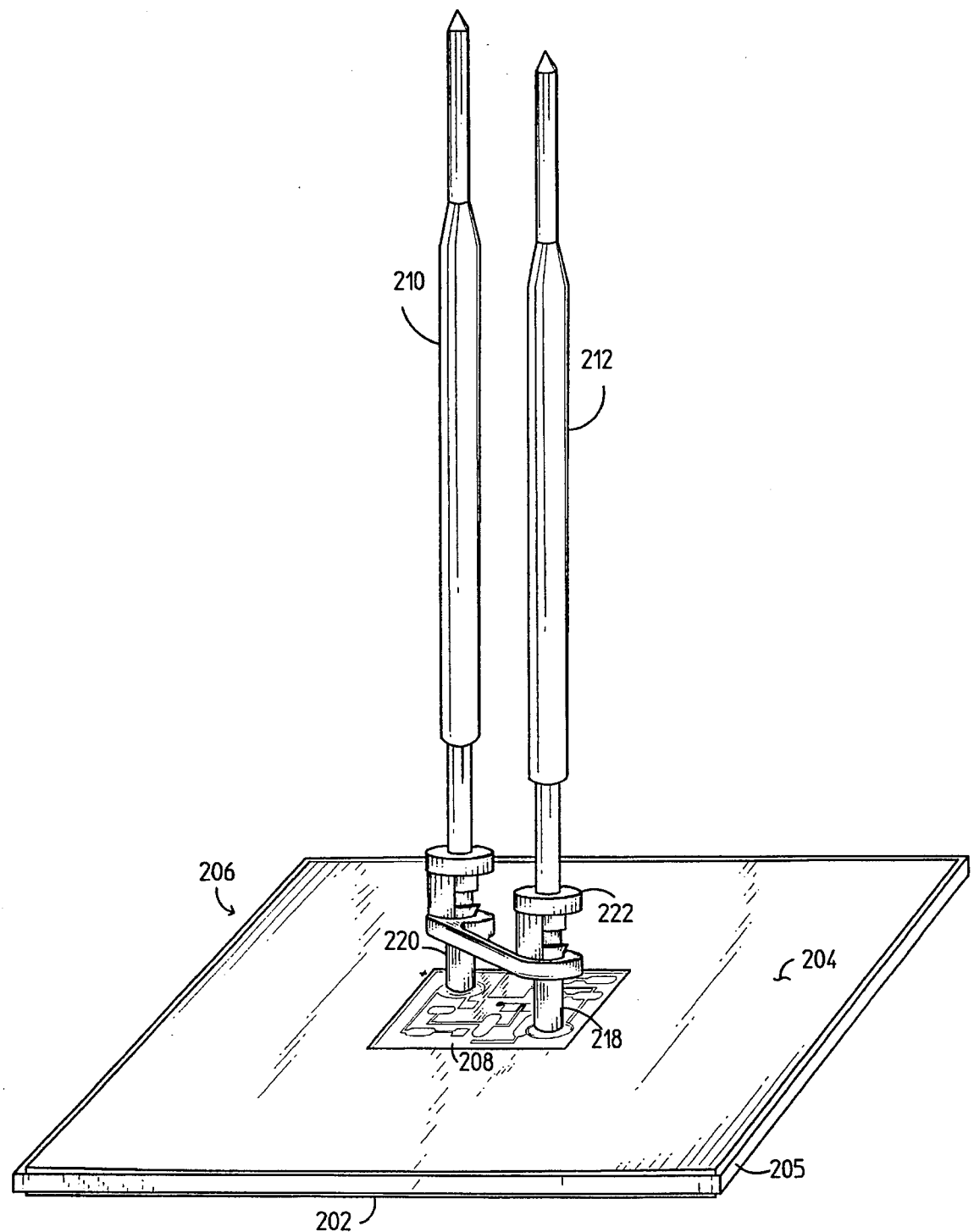
FIG. 2 shows a top, front perspective view of the first embodiment of the present invention.
Figure 3:
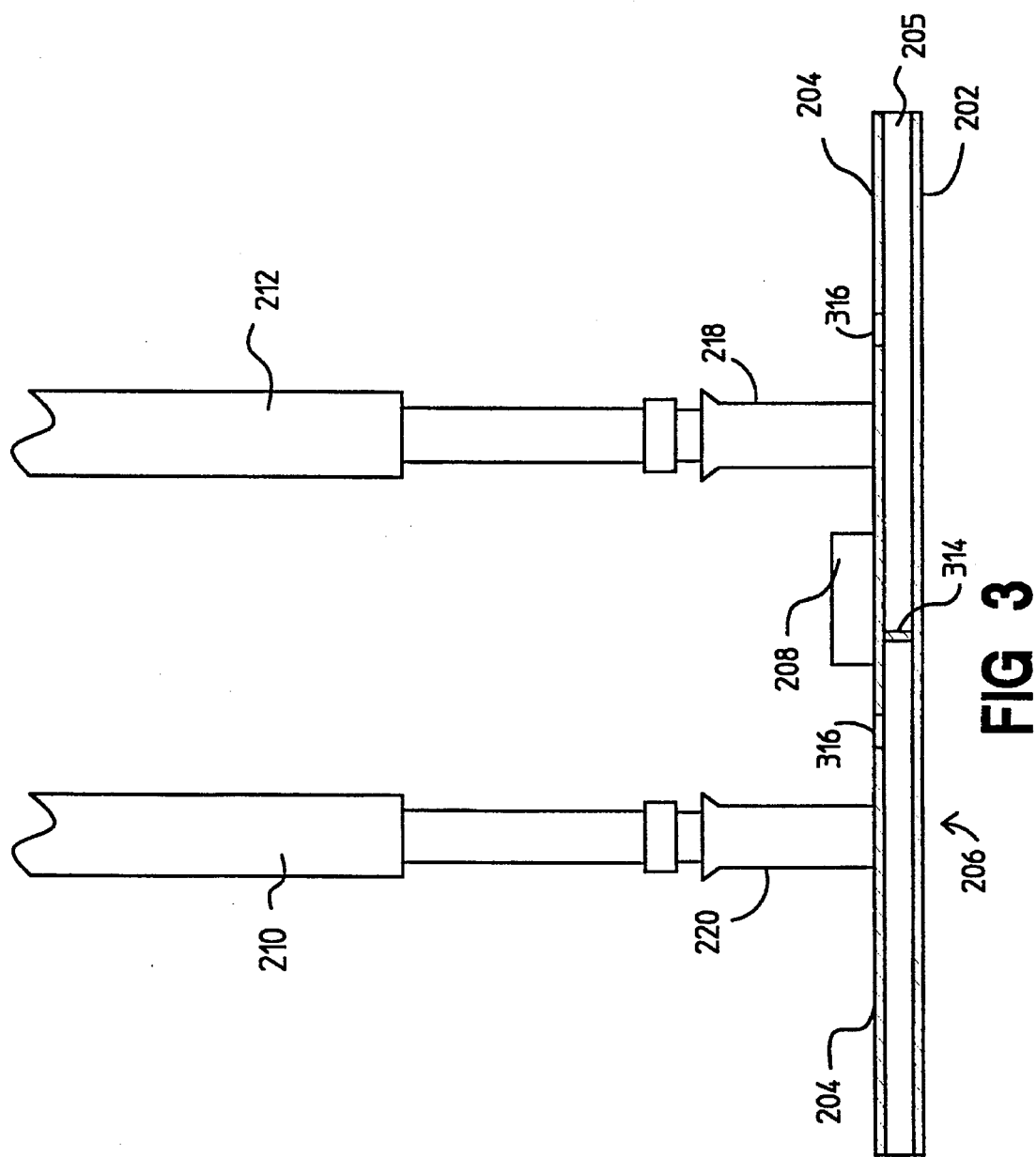
FIG. 3 shows a side cut away view of the first embodiment of the present invention.

FIG. 2 shows a top, front perspective view of the test probe and FIG. 3 shows a side cut-away view of the test probe. Referring now to FIGS. 2 and 3, the capacitive test probe 206 includes a capacitive plate 202, a guard plate 204, an active buffer circuit 208, a guard electrode spring pin 210 and a signal electrode spring pin 212. The capacitive plate 202 and the guard plate 204 in the present invention are made of copper, but can be made of any electrically conductive material. The capacitive plate 202 and the guard plate 204 are separated by a dielectric 205, such as glass filled plastic or any other insulative material. The dielectric is approximately 0.04 inches thick. It should be understood that if the dielectric 205 is too thin, the capacitive reading will be distorted upward, and if the dielectric is too thick, the shielding effect of the guard plate will be reduced and stray system capacitance will be detected. The capacitive plate in the present invention forms a capacitor with the conductive plate in the integrated circuit (see FIG. 4). The capacitive plate 202 of the test probe 206 is electrically coupled to an active buffer circuit 208, which is located on the top surface of the dielectric and surrounded by the guard plate 204. The capacitive plate 202 is connected to the buffer circuit 208 at a location 314 (see FIG. 3). The amplification of the signal by the buffer circuit 208 which is in close proximity to the capacitive plate 202 where the signal is received helps to significantly optimize the signal to noise ratio, thereby decreasing the effect of system noise and stray capacitance. However, this can be accomplished by other means such as shielding by means of a coaxial cable or a conductive foam surrounding the spring pins 210 and 212. Further, after learning what the unwanted signal and noise is, this value can merely be subtracted from the signal detected by the measuring device 122. This technique is called learning compensation. For the purposes of this description, the term noise includes both random noise as well as undesired responses that are not random.

During manufacturing, the dielectric 205 is deposited on the capacitive plate 202 and then the guard plate 204 is deposited on the dielectric. Next, the guard plate is etched down to the dielectric 205 to form traces for a buffer circuit 208 and a groove 316 is etched all the way around the buffer circuit area to electrically isolate the buffer circuit from the guard plate. During manufacturing, the buffer circuit 208 is mounted to the traces formed from the guard plate by using a chip on board procedure. The buffer circuit is electrically connected by a pin in socket connector 218 to a standard signal electrode spring pin 212, which acts as an electrical coupling means to a measuring device. The guard plate 204 is electrically connected via connector 220 to a guard electrode spring pin 210, which electrically couples the guard plate to system ground or a controlled voltage source.

Spring pins 210 and 212 can be standard off-the-shelf spring pins, such as a 100PR4070 made by QA Technology Company of Hampton, New Hampshire. Spring pins 210 and 212 give the test probe z axis travel, which allows for intimate coupling with the integrated circuit component to be tested, regardless of the height of the component. Also, when the invention is used to test an entire circuit board, as in FIG. 1, the z axis travel of the spring pins permit all of the test probes 206 to intimately contact the corresponding components, even if the heights of the components are not uniform. This z axis travel can be accomplished by other means such as hydraulic pins with z axis travel. Moreover, the z axis travel is not necessary, as long as the test probe is a predetermined distance from the I.C. package so that there is an exited range of results. Therefore, the test probe can be mounted directly into the test plate 101 without spring pins or with spacers.

The spring pins 210 and 212 are attached to standard connectors 218 and 220 via pin in socket coupling. Connectors 218 and 220 can be standard off-the-shelf connectors such as Amp Connector 2-331272-7 by AMP Incorporated, Harrisburg, Pa. 17105-3608. The connectors 218 and 220 are soldered to the buffer circuit 208 and to the guard plate 204, respectively. The pin in socket coupling between the spring pins and the connectors is flexible enough to create a slight x,y plane swivel, which allows the test probe 206 to conform to the top surface of the integrated circuit to be tested, if the bottom surface of the test probe 206 is angularly offset from the top surface of the I.C. component, thus allowing a substantially uniform distance to be maintained between the test probe 206 and the I.C. component. A clip 222 can be used to lock the spring pins into the connector sockets 218 and 220, which still allows a slight x,y plane swivel, while securing the spring pins to the connectors. This x,y plane and z axis flexibility can also be accomplished by using a flexible mylar film or a conductive foam rubber in place of capacitive plate 202 and the spring pins 210 and 212. Also, the conductive plate can be a deformable conductive material so that it can conform to match the surface of the element under test. The term electrical component is intended to mean active component, passive component, electrical connectors such as pin connectors, sockets or other devices that have a solder connection between the P.C. board trace and the device.

The test probe 206 must be of substantially the same size and dimensions as the integrated circuit package being tested. If the test probe 206 is larger than integrated circuit package, there may be capacitive coupling with the printed circuit board wire traces, thus, affecting the test measurements. Also, if the test probe 206 is significantly smaller than the integrated circuit package, the test probe must be placed more accurately or it may not be over the conductive plate 404 of the lead frame (see FIG. 4), thus, giving a false indication of a pin open fault. Making the test probe the same size as the I.C. package may be accomplished by either making the test probes in many standard integrated circuit package sizes, or more ideally, making the guard and capacitive plates of a large enough size so that the final user can mill, cut or sand the dimensions of the test probe to meet the particular dimensions of the integrated circuits being tested. The present test probe can be shaped quite easily by the end user and cutting lines for standard I.C. package sizes may even be placed on the top surface of the guard plate or the bottom surface of the capacitive plate during manufacturing. The test probe must also be fixed against z axis rotation, as the probe and the I.C. package are generally square or rectangular, therefore, if the test probe rotates along the z axis, one or more of the four corners of the test probe may hang over the sides of the I.C. package and detect stray capacitance. One method to fix the test probe against z axis rotation is to use at least two spring pins 210 and 212 and a stabilization clip 222.

Figure 4:
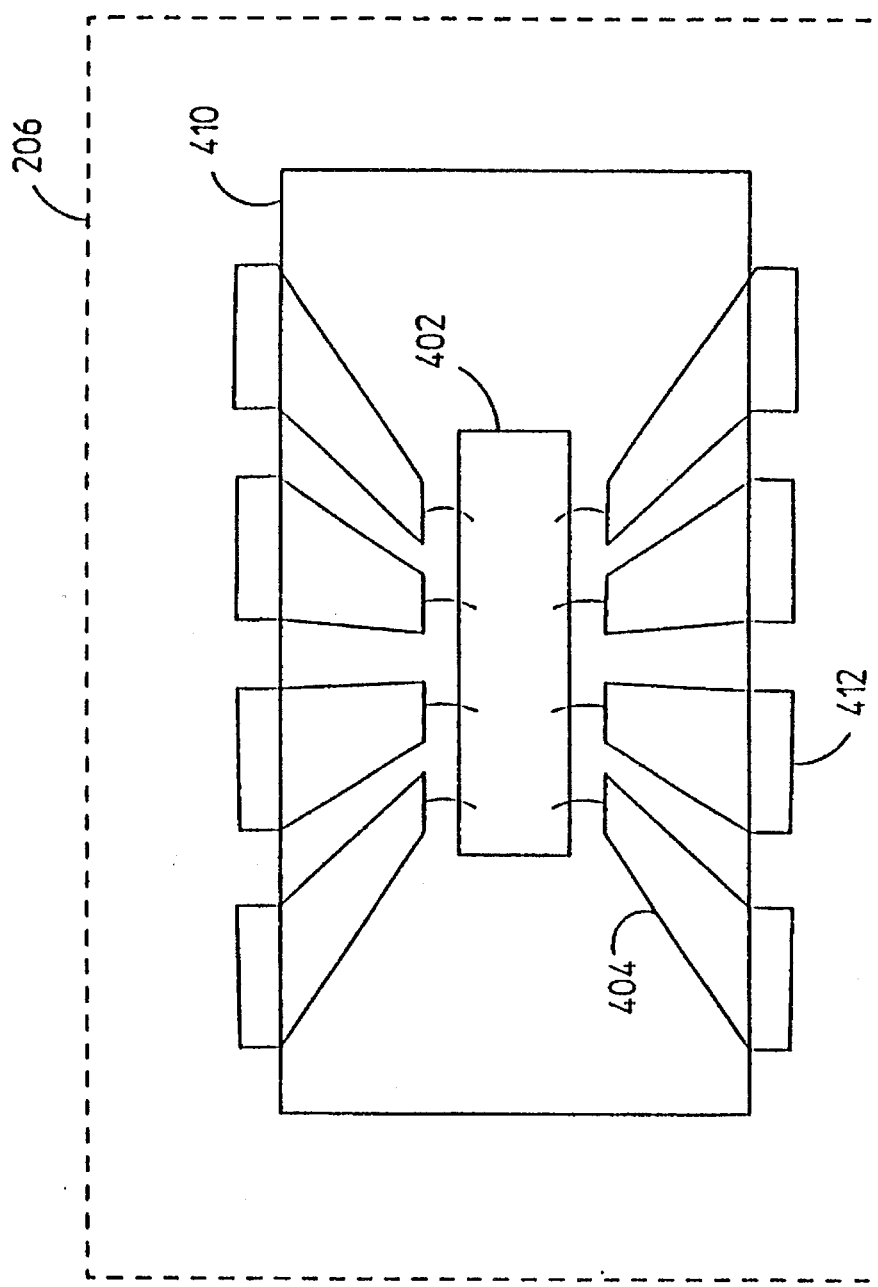
FIG. 4 shows a cut-away view of an integrated circuit parallel to the lead frame viewed from the top.
Figure 5:
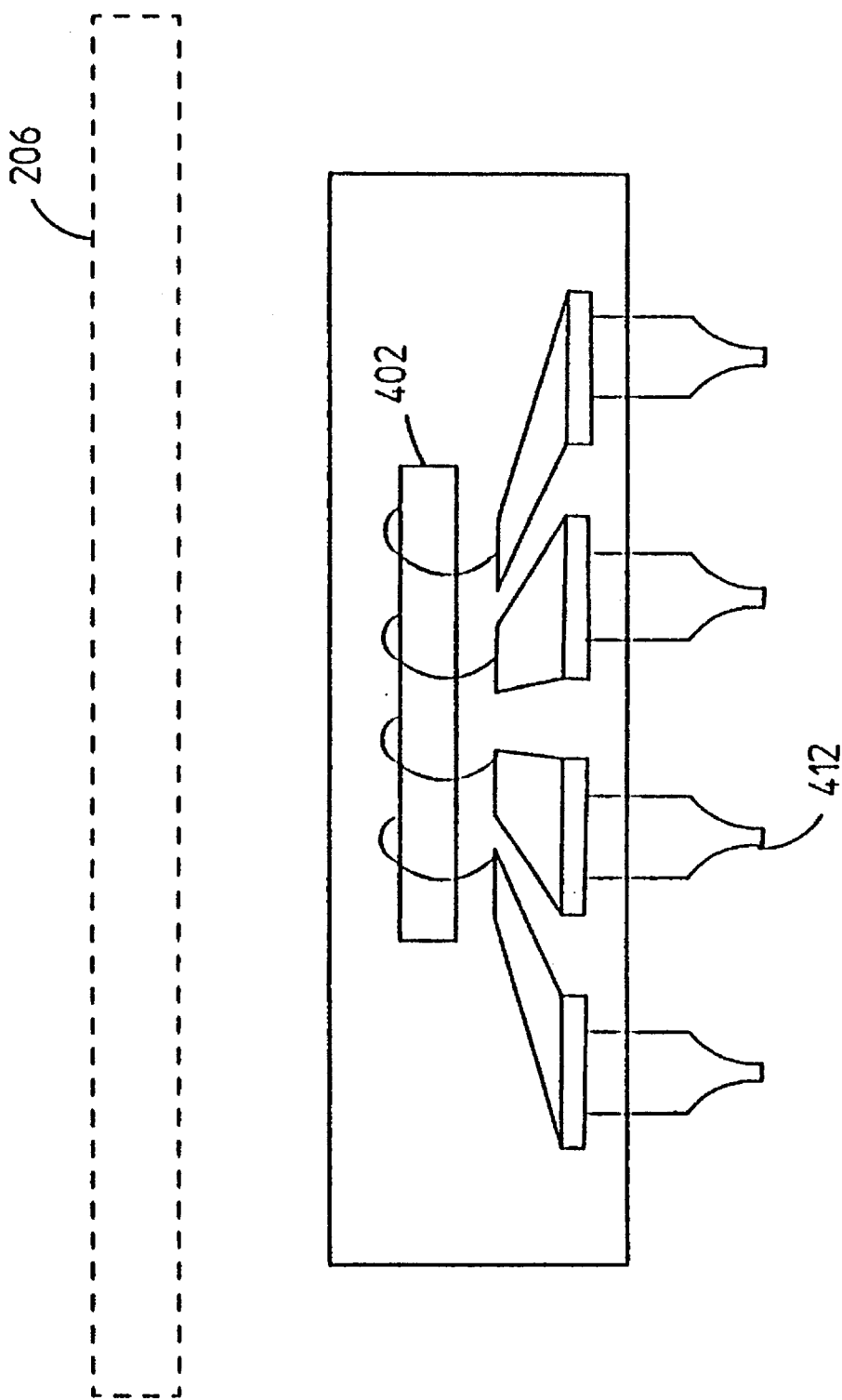
FIG. 5 shows a side cut-away view of an integrated circuit and illustrates, along with FIG. 4, how capacitive coupling occurs.

FIG. 4 shows a top cut away view of the integrated circuit component 410 and the capacitive test probe 206 and FIG. 5 shows a side cut away view of the integrated circuit component 410 and the capacitive test probe 206. FIGS. 4 and 5 illustrate how the capacitive coupling occurs between the capacitive test probe 206 and the leads 412 of the integrated circuit. Referring now to FIGS. 4 and 5, the integrated circuit package 410 contains an integrated circuit die 402. The integrated circuit die 402 contains connections, however, these connections must be made to the outside of the integrated circuit package 410. Therefore, the lead 412 is connected to an internal conductor 404 which connects the lead 412 to a location just adjacent to the integrated circuit 402. There a small wire (bond wire) spans between the conductor 404 and a location on the integrated circuit 402. Similar connections are made to all the other leads of the integrated circuit package 410.

The conductor 404 forms an electrically conductive plate, which acts as one plate of a capacitor. The other plate of the capacitor is formed by a capacitive plate of the capacitive test probe 206 (see FIG. 3). Although the capacitor created in this manner is small, it is sufficient to conduct a signal between the lead 412 and the capacitive test probe 206, here illustrated by dashed lines, indicating that the test probe 206 is placed over the top of the integrated circuit package 410. As stated above the test probe 206 must be of substantially the same size and dimensions as the integrated circuit package 410.

Figure 6:
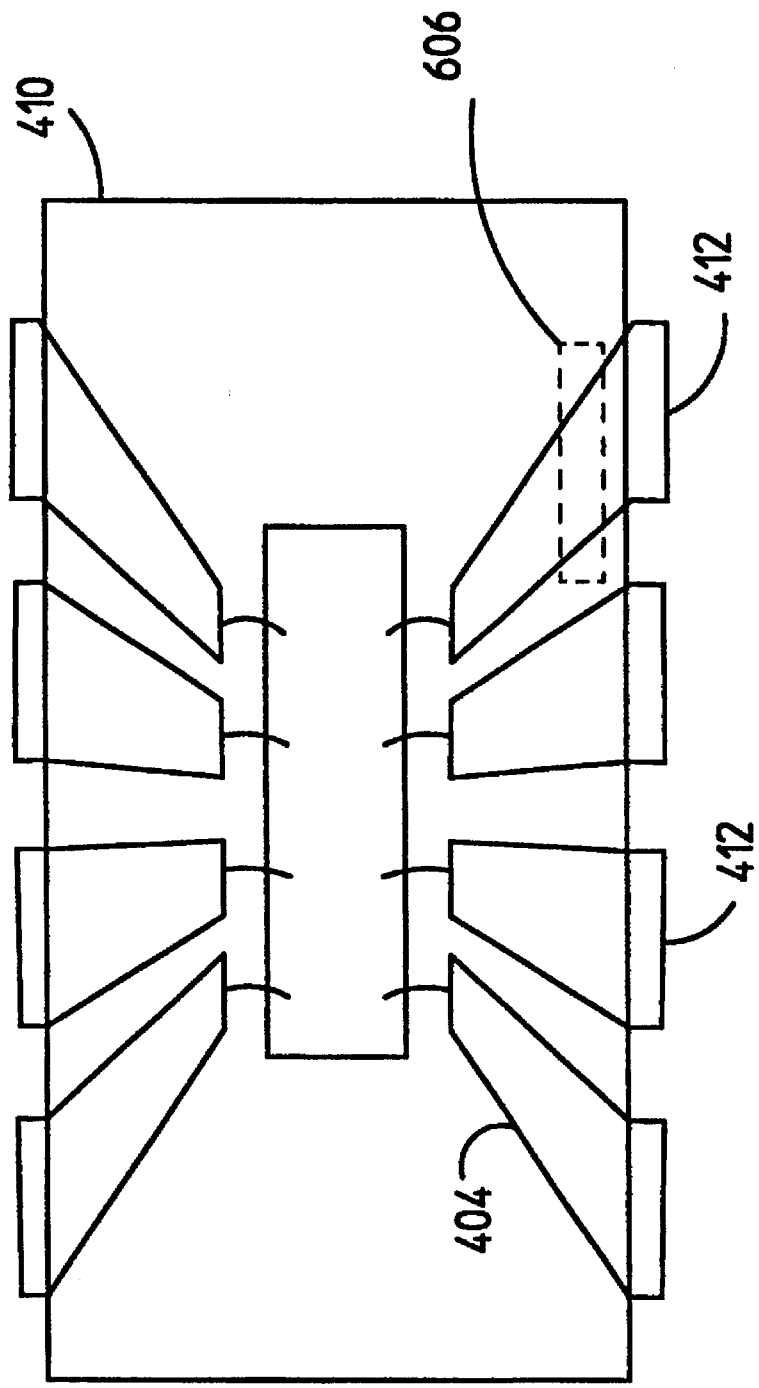
FIG. 6 shows a top cut-away view of an integrated circuit and illustrates the use of a very small test probe that can be placed over a single lead of an integrated circuit.

FIG. 6 shows a diagram of a very small test probe, which is placed only over the surface area of at least a single lead connector of an integrated circuit. Referring now to FIG. 6, an integrated circuit 410 has a lead 412 with a very small test probe 606 placed over top of the lead connector 404. By moving the smaller test probe 606 around the top of the integrated circuit 410, each lead can be probed separately. One advantage of this embodiment is that the test probe is a one size fits all test probe and does not require customized sizing. However, this technique could result in a smaller capacitance being measured. In which case, the shielding against stray capacitance would become more important, as does the precision of placement of the test probe over the individual lead connectors 404.

Figure 7:
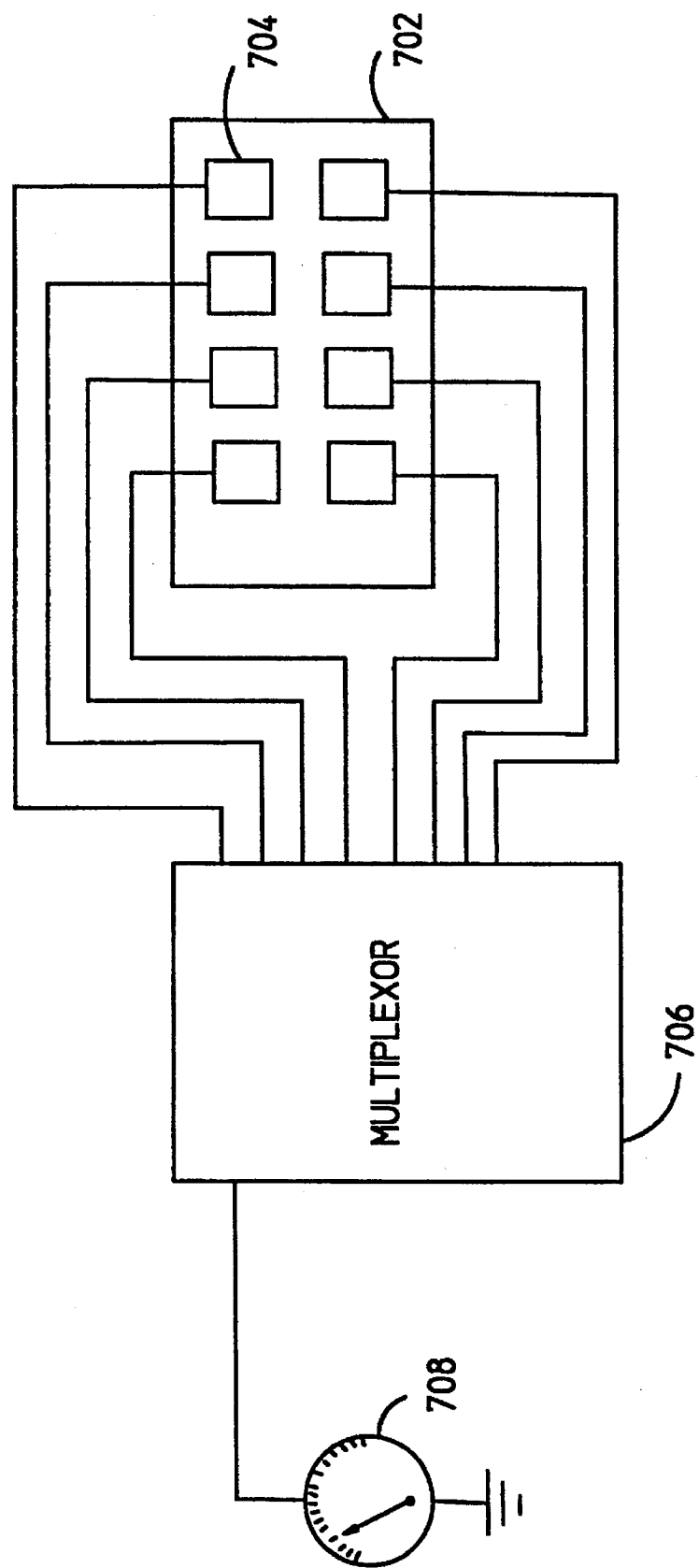
FIG. 7 shows a segmented test probe that is used to separately test each lead of an integrated circuit.

The technique of FIG. 6 can be extended by creating a segmented probe as shown in FIG. 7. Referring now to FIG. 7, a probe 702 has a number of very small segments, such as segment 704, each of which will be located over a single lead connector 404 when the test probe 704 is placed on top of an integrated circuit. Each of the segments is connected to a multiplexor 706, and the output of the multiplexor is connected to a measurement device 708. When using the segmented probe 702, the signal source is connected to the P.C. board traces in the same manner as FIGS. 1 and 8.

Figure 8:
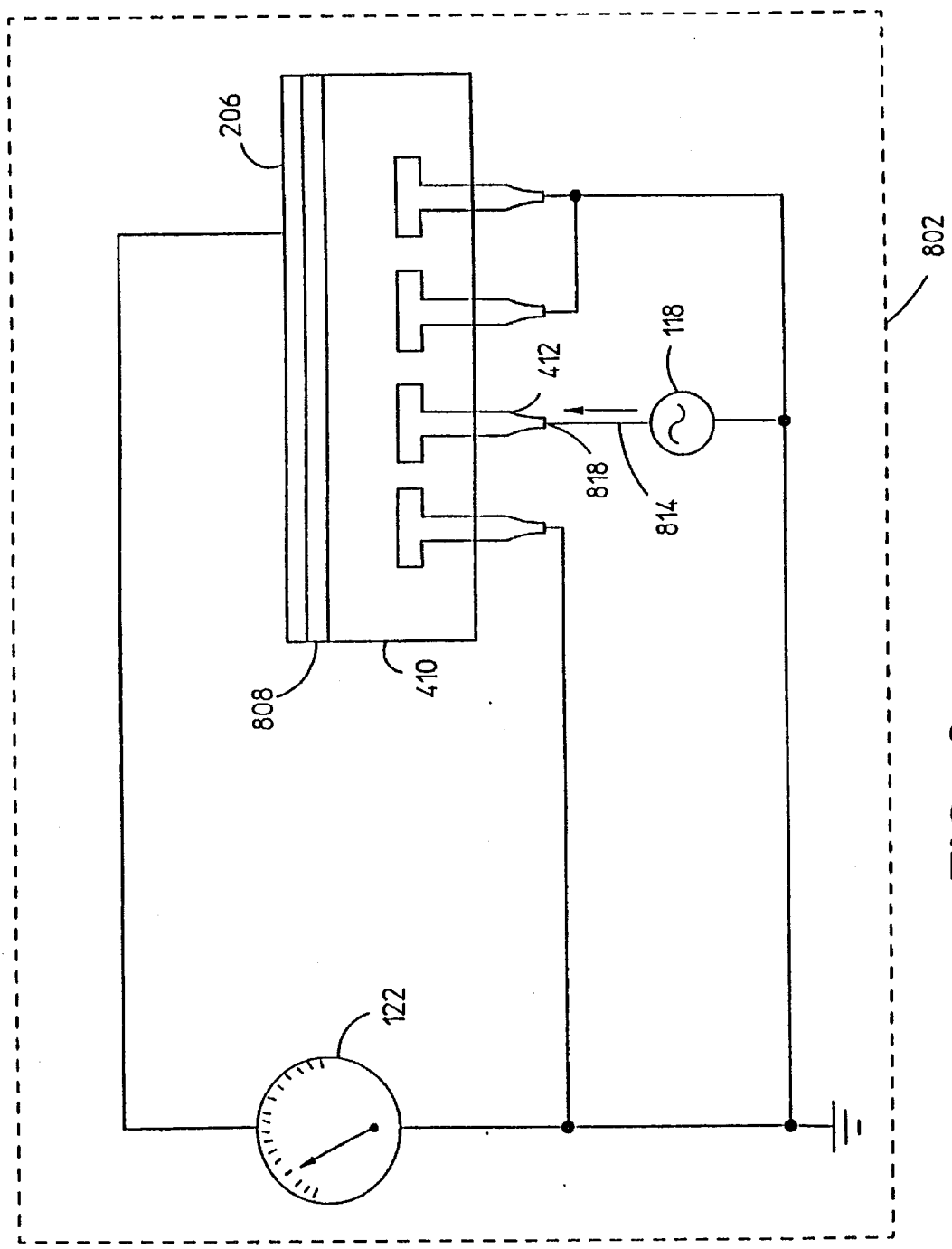
FIG. 8 shows a schematic diagram of one implementation of the present invention.

FIG. 8 shows a schematic overall view of an implementation of the device of the present invention. Referring now to FIG. 8, the system of one implementation of the present invention 802 uses a signal source 118, which supplies a signal, typically eight kiloHertz (8 KHz) at two hundred millivolts (200 mV). The output of signal source 118 is connected to a printed circuit board trace 814, which is connected to the integrated circuit lead under test 412 at 818. The connection of the signal source 118 to the trace 814 is typically made through a bed of nails connection pin.

A capacitive test probe 206 is placed on top of the integrated circuit package 410. A thin dielectric 808 may be placed between the component package 410 and the test probe 206. The capacitive test probe 206 is connected to a measuring device 122, such as an ammeter, a voltmeter or computing means to compute the effective capacitance. When the measurement falls outside predetermined limits a determination is made that the lead being tested is diagnosed as being open.

When the test is performed, the signal source 118 is activated and applied to trace 814 on the printed circuit board which should be attached to the lead being tested 412 at location 818. The signal should then pass to the lead 412 of the component 410. Through capacitive coupling, the signal is passed to the capacitive test probe 206 and then to the measuring device 112. If the measured parameter falls within predetermined limits, then the lead 412 is connected to the trace 814 at location 818. If the lead 412 is not connected at location 818 or if the wire trace 814 is broken, a smaller signed will be conducted to the capacitive test probe 206 and tile threshold level of tile signal will not be measured by the measuring device 122, indicating that an open fault is present.

As the signals being measured are extremely small, the effects of noise, system capacitance and cross-talk must be minimized as much as possible. One technique to reduce undesired capacitance when testing an integrated circuit, is to guard all ground, power and other device leads not directly involved in the measurement of the integrated circuit. The grounding of unused leads is called "guarding" which is presently considered the best mode to reduce noise. This guarding prevents cross-talk between the lead being tested and other leads on the integrated circuit component, thus, reducing any stray capacitive coupling between leads and providing a better indication of when a lead is not connected. This technique is particularly effective since this usually grounds the printed circuit board ground plane which is also connected to many leads oil other integrated circuits, thus reducing levels of undesired capacitance.

In place of the buffer circuit and shielding another technique is to use a learned value measurement. With the learning technique a known good board is measured with the measuring device and the capacitance value for each pin is stored. The capacitance for each pin of every unknown board is measured and compared to the learned capacitance for each pin. If the capacitance change for any pin is more than a predetermined amount, then the unknown boards solder joint is defective. As an example experimental data has shown that the capacitance between the component lead and the test probe is approximately 40 femto farads of capacitance for a 0.65 mm pitch quad flat pack. If the capacitance change for a pin is more than 30 femto farads, than the solder joint is open. This value could be increased or decreased by the user to improve the diagnostic accuracy of the test.

Figure 9:
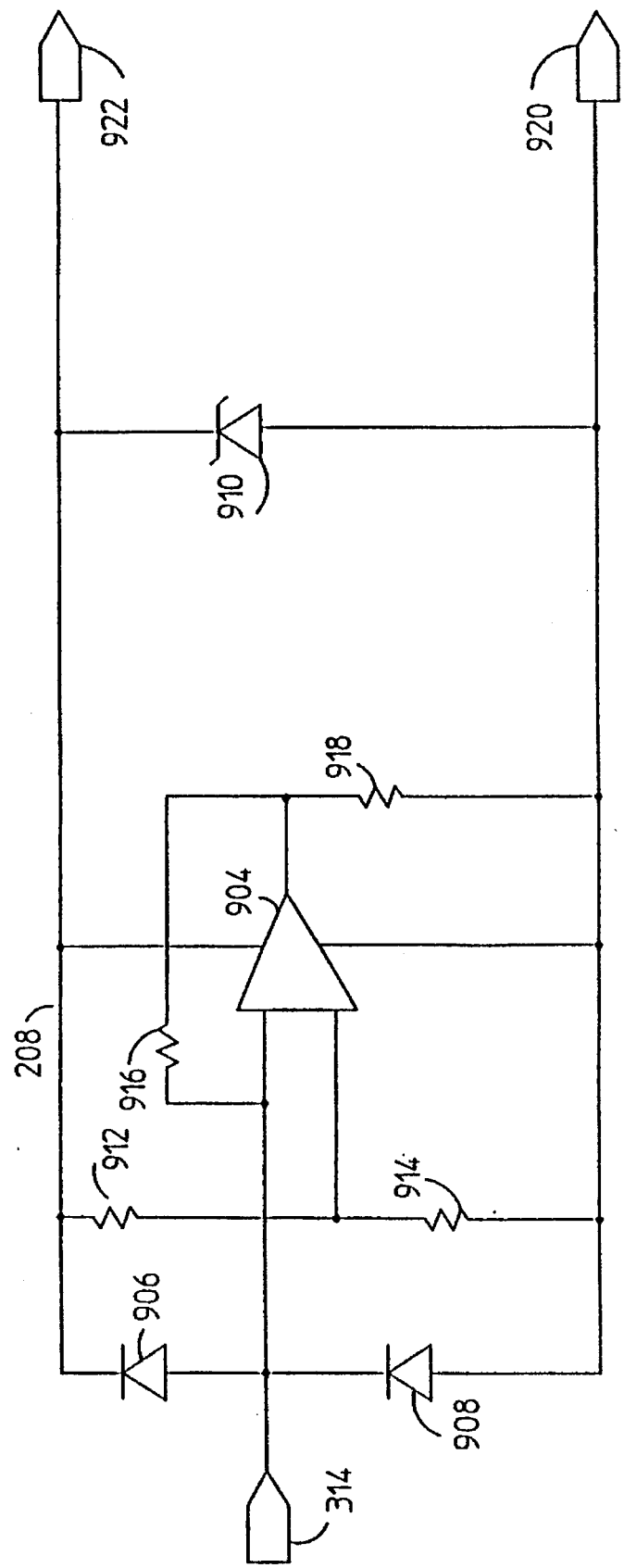
FIG. 9 shows a schematic diagram of the active buffer circuit used on the test probe of the present invention.

FIG. 9 is a schematic of the active buffer circuit 208 used in accordance with the present invention. Referring now to FIG. 9, the buffer circuit 208 is a standard amplifier circuit used to amplify the signal received from the capacitive plate at 314, thus increasing the signal to noise ratio and decreasing the effects of stray capacitance. There can be many alternative circuits to accomplish this amplifying effect as would be readily apparent by an artisan in the field. The amplifier 904 is a standard operational amplifier, such as a TL072 by Texas Instruments of Dallas, Tex. Diodes 906 and 908 are standard silicon small signal diodes and diode 910 is a 7.5 V zener diode. Resistors 912 and 914 are 100 K ohm resistors and resistors 916 and 918 are 1 M ohm and 464 ohm resistors, respectively. The circuit output 922 is electrically coupled to the signal spring pin 212 and the circuit ground 920 is electrically coupled to system ground by guard spring pin 210. Active buffer circuit 208 is utilized in the present invention to reduce the effects of stray capacitance by amplifying the signal, thus making stray capacitance relatively insignificant. This circuit is used as it is cost effective and easy to implement. However, other shielding means could be used, such as a coaxial cable around the spring pin 212 and attached to or in place of the guard plane 204 of the test probe 206.

Figure 10:
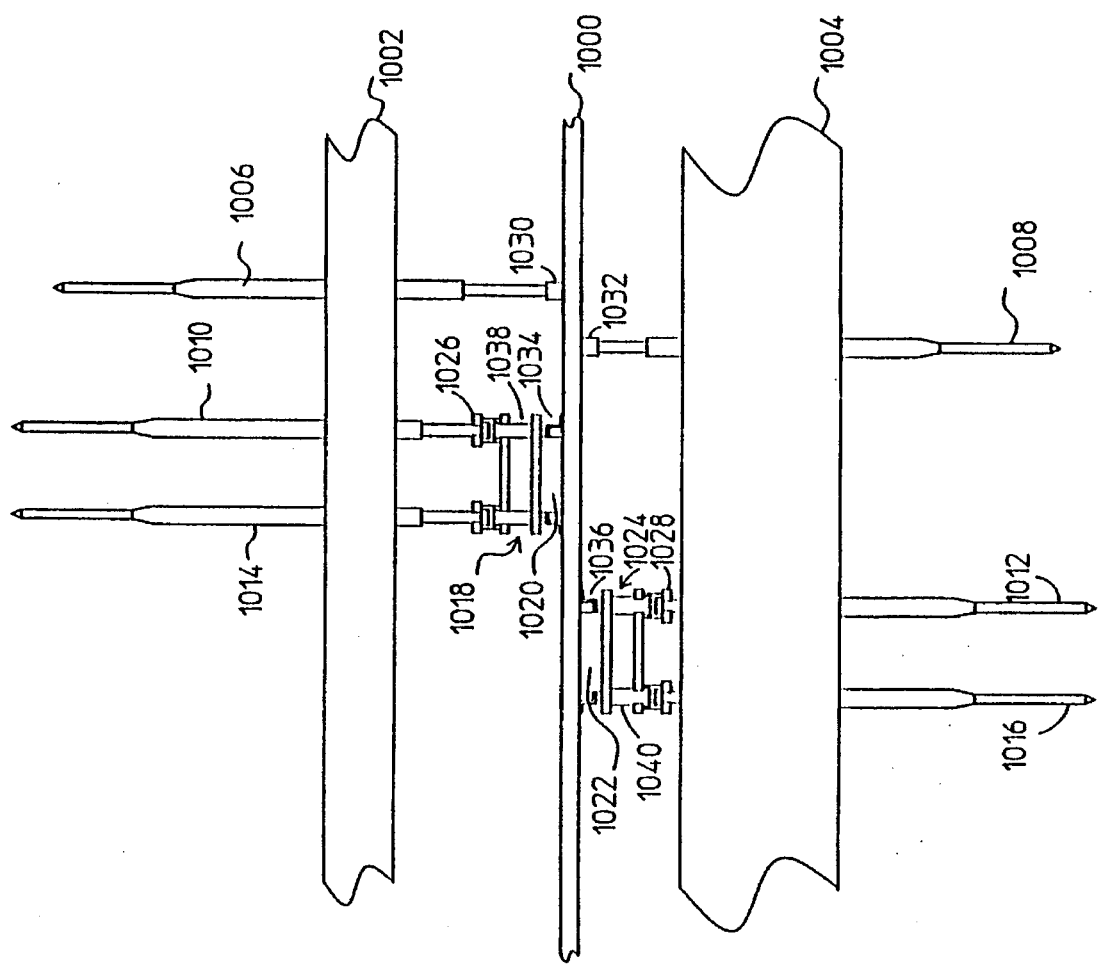
FIG. 10 shows a side cut away view of an implementation of the invention being used to test a plurality of integrated circuits on both the top and bottom surfaces of a printed circuit board.

FIG. 10 shows a side cut-away view of another implementation of the present invention used to test a plurality of integrated circuits on both the top and bottom side of a printed circuit board. Referring now to FIG. 10, test probes 1018 and 1024 are mounted in test fixture mounting plates 1002 and 1004, so that test probes 1018 and 1024 will correspondingly mate with integrated circuit packages 1020 and 1022 when the test fixtures 1002 and 1004 are mated with the printed circuit board under test 1000. In this embodiment, a signal is supplied to printed circuit board traces at 1030 and 1032 by bed of nails type pins 1006 and 1008 mounted in the test fixture mounting plates 1002 and 1004. The trace will supply the signal to the integrated circuit through the leads 1034 and 1036. The signal will pass to the test probes 1018 and 1024 through capacitive coupling. The signal will then pass to a measuring device (not shown) through the signal spring pins 1010 and 1012. Guard spring pins 1014 and 1016 are connected to system ground or a controlled voltage (not shown).

Tile connectors 1038 and 1040, which am soldered to tile top surface of the test probes 1018 and 1024, and the spring pins 1010, 1012, 1014 and 1016 are held together by clamps 1026 and 1028, respectively. Clamps 1026 and 1028 not only hold the pin in socket connections made between the spring pins and the connectors together, but also help to fix the test probes 1018 and 1024 against z axis rotation. The clamps 1026 mid 1028 are made of any dielectric material, such as polycarbonate or any substantially plastic material. This implementation of the invention functions similarly to the embodiments of FIG.1 and FIG. 8.

Figure 11:
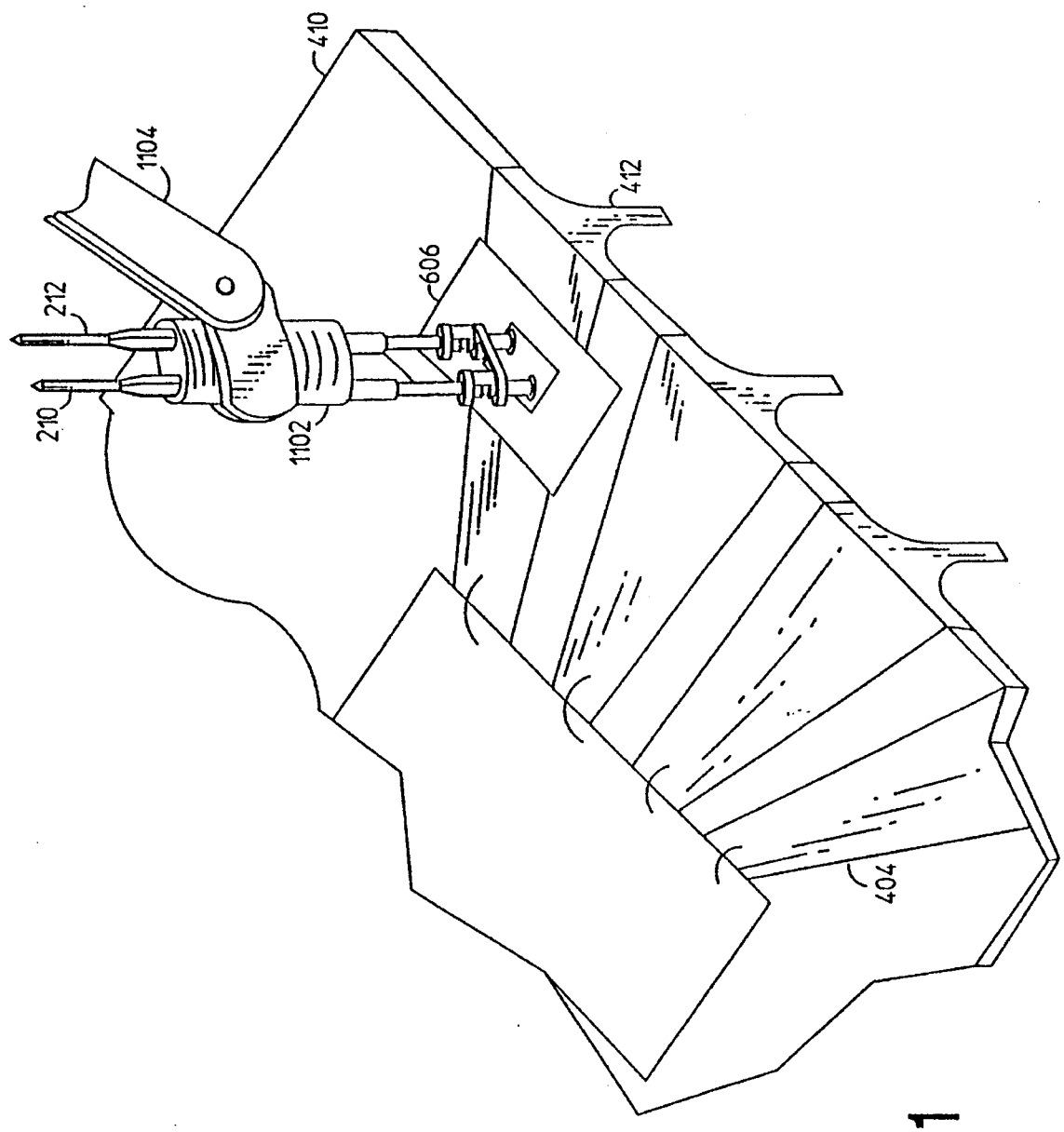
FIG. 11 shows a perspective view of another implementation of the invention, wherein the test probe is very small and is being used in conjunction with a test robot to test each lead of an integrated circuit.

FIG. 11 shows a cut-away perspective view of another implementation of the invention in which the test probe is very small as in FIG. 6. Referring now to FIG. 11, the smaller test probe 606 is being used in conjunction with a test robot (not shown) to test each lead 412 of an integrated circuit 410 individually. For this implementation, the test probe 606 has a rubber grip surrounding the spring pins 210 and 212 to enable the mechanical arm 1104 of the robot to grab the test probe. The robot is then programmed for the coordinates of each lead connector 404. The robot should have three (3) dimension mobility, such as the robots produced by Anorad Corporation, Hauppauge, N.Y. 11788. It should be noted that a robot test system could also be used with a larger test probe as in FIGS. 2 and 3 to test I.C. packages and other electrical components. Further, the test probe could be mounted to the test robot arm, rather than having the robot grab the test probe. These robot test systems would utilize the test procedure as in FIG. 8.

Figure 12:
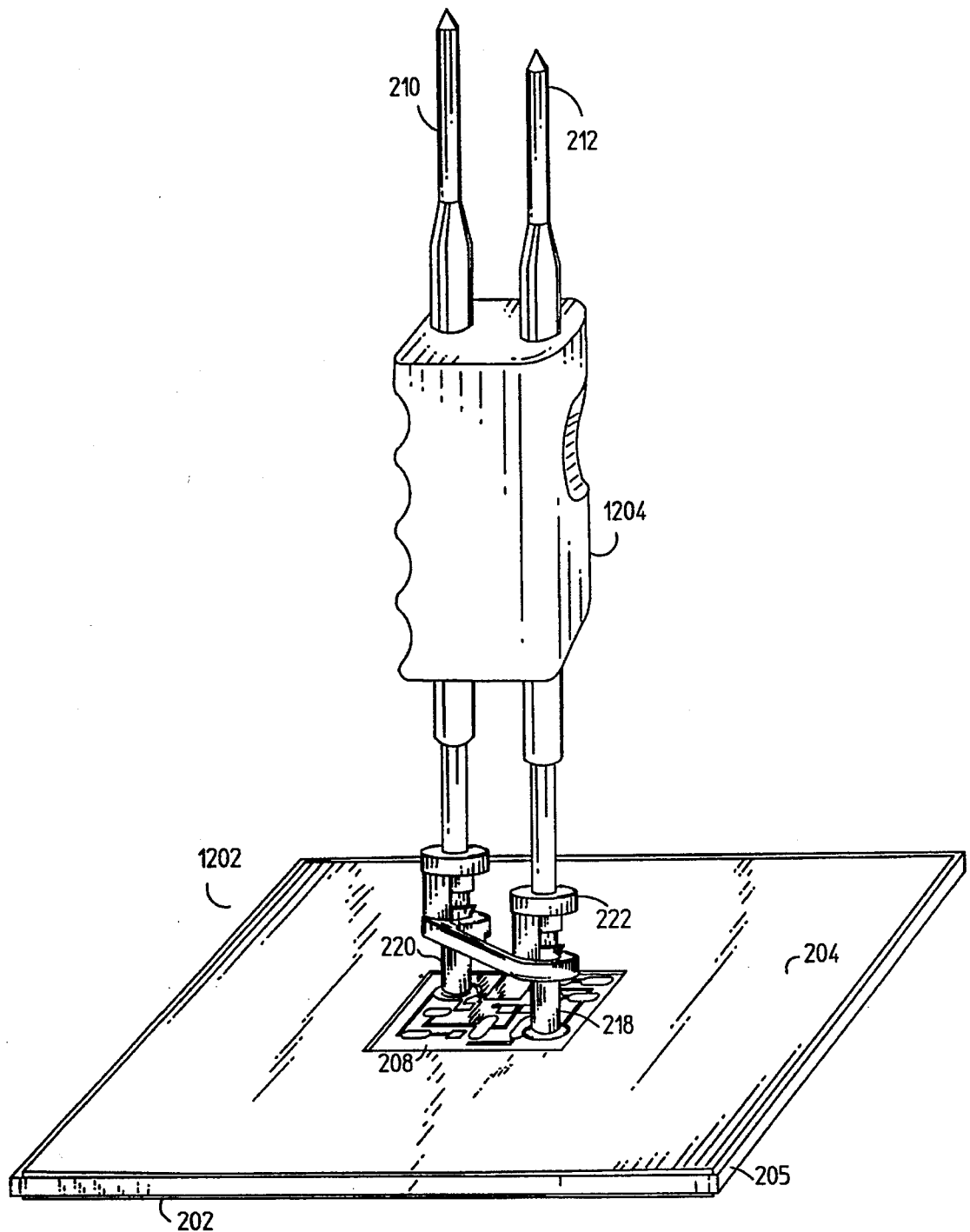
FIG. 12 shows a perspective view of another embodiment of the test probe, which is a hand held test probe.

There are instances in which it is not financially advantageous to use a test board system as in FIGS. 1 and 10 or a test robot system as in FIG. 11. For example, it may not be cost effective to design such systems when testing prototypes or circuit boards produced in small quantities. In such cases, it may be more cost effective to use a manual test system. A manual test system would utilize a hand held test probe as in FIG. 12. A perspective view of a hand held test probe is shown in FIG. 12. Referring now to FIG. 12, a test probe 1202, as in FIG. 2 is shown, with a conductive plate 202, a dielectric 205, a guard plate 204, a buffer circuit 208, connectors 218 and 220 and spring pins 210 and 212. The test probe 1202 also shows clip 222 for securing the spring pins 210 and 212 to connectors 218 and 220, respectively. The test probe 1202 further shows a hand grip 1204, which allows the test probe 1202 to be manually held. This embodiment of the test probe would utilize the same test procedure as in FIG. 8 with a cable (not shown) connecting spring pins 210 and 212 to the measurement device and ground or a constant voltage source, respectively.

Although the test probes described above are shown testing an electrical component such as an integrated circuit, the technique will work equally well with other types of electrical components with discrete leads including but not limited to transistors, diodes, resistors, inductors, capacitors and connectors. It will also work with analog electrical components or discrete components such as resistors and capacitors.

The foregoing description of the invention has been presented for purposes of illustration and description. It is not intended to be exhaustive or to limit the invention to the precise form disclosed, and other modifications and variations may be possible in light of the above teachings. For example, shielding means other than a guard plane and a buffer circuit may be used to shield stray capacitance as will be readily apparent by one skilled in the art. Also, the bottom capacitive plate of the test probe may have either a conductive lower surface or an insulative lower surface, as will be readily evident. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A test probe for testing an electrical component to determine whether a connector lead of said electrical component is conductively connected to a trace of a printed circuit board, wherein said test probe is placed in close proximity with a top surface of said electrical component such that when a signal is supplied to said trace of said printed circuit board, a measuring device attached to said test probe to indicate an error if said measuring device fails to detect a predetermined capacitively sensed signal level, said test probe comprising:

conductive plate means for capacitively detecting an electrical field generated by said connector lead of said electrical component whenever said connector lead is conductively connected to said trace producing a test signal;

shielding means for providing shielding from electrical noise;

signal amplification means electrically coupled to said conductive plate said test signal to increase the signal to noise ratio, said signal amplification means and said shielding means being disposed on said test probe in sufficient proximity to said conductive plate means to achieve a sufficient signal to noise ratio of said test signal to electrical noise so that said measuring device can determine whether said connector lead of said electrical component is conductively connected to said trace;

at least one connector means electrically connected to said amplification means for connecting at least one test pin to said test probe; and at least one test pin electrically and mechanically connected to said at least one connector means, said at least one test pin providing said test probe with travel along the z axis, such that said test probe is capable of conforming to an outer surface of said electrical component when brought into close proximity therewith.

2. The test probe of claim 1 wherein said connector means comprises at least one pin and socket connector.

3. The test probe of claim 1 further comprising:

clamping means for securing a connection between said at least one connector means and said at least one test pin.

4. The test probe of claim 3 wherein said clamping means comprises a plastic clip.

5. The test probe of claim 1 wherein said at least one test pin comprises an electronic spring test pin for electrically transferring said signal from said test probe to said measuring device, said at least one electronic spring test pin allowing said test probe to travel along the z axis and thereby maintain intimate contact with said electrical component when brought into physical proximity therewith.

6. The test pin of claim 5 wherein said at least one connector means has x, y axis swivel capability for allowing said test probe to conform to the top surface of said electrical component.

7. The test probe of claim 6 wherein there is sufficient clearance between said at least one electronic spring test pin and said at least one connector means to allow for x, y axis swivel so that said test probe can conform to the top surface of said electronic component.

8. The test probe of claim 1 wherein said test probe comprises a hand held test probe.

9. The test probe of claim 1 wherein said test probe comprises a robot test system mountable test probe.

10. The test probe of claim 1 wherein said signal amplification means comprises an active buffer circuit.

* * * * *

UNITED STATES PATENT AND TRADEMARK OFFICE
CERTIFICATE OF CORRECTION

PATENT NO. : 5,498,964
DATED : March 12, 1996
INVENTOR(S) : Ronald K. Kerschner, David T. Crook, Lisa M. Kent It is certified that error appears in the above-indentified patent and that said Letters Patent is hereby corrected as shown below:

Col. 10, Claim 1, 1. 18: After "plate" insert --for amplifying--

Col. 10, Claim 1, 1. 32: "means,said" should read --means, said--

Signed and Sealed this

Eighteenth Day of March, 1997

Attest:

BRUCE LEHMAN

Attesting Officer

Commissioner of Patents and Trademarks